US012444616B2

(12) United States Patent
Park et al.

(10) Patent No.: US 12,444,616 B2
(45) Date of Patent: Oct. 14, 2025

(54) POLISHING COMPOSITION FOR SEMICONDUCTOR PROCESSING POLISHING COMPOSITION PREPARATION METHOD, AND SEMICONDUCTOR DEVICE MANUFACTURING METHOD TO WHICH POLISHING COMPOSITION IS APPLIED

(71) Applicant: SK enpulse Co., Ltd., Gyeonggi-do (KR)

(72) Inventors: Han Teo Park, Seoul (KR); Deok Su Han, Seoul (KR); Jang Kuk Kwon, Seoul (KR); Seung Chul Hong, Seoul (KR)

(73) Assignee: SK enpulse Co., Ltd., Gyeonggi-do (KR)

( * ) Notice: Subject to any disclaimer, the term of this patent is extended or adjusted under 35 U.S.C. 154(b) by 257 days.

(21) Appl. No.: 18/255,783

(22) PCT Filed: Oct. 18, 2021

(86) PCT No.: PCT/KR2021/014483
§ 371 (c)(1),
(2) Date: Jun. 2, 2023

(87) PCT Pub. No.: WO2022/145653
PCT Pub. Date: Jul. 7, 2022

(65) Prior Publication Data
US 2024/0030041 A1    Jan. 25, 2024

(30) Foreign Application Priority Data

Dec. 30, 2020   (KR) .................. 10-2020-0187468
Oct. 18, 2021   (KR) .................. 10-2021-0138360

(51) Int. Cl.
*H01L 21/321*   (2006.01)
*C09G 1/02*     (2006.01)
(Continued)

(52) U.S. Cl.
CPC ............ *H01L 21/3212* (2013.01); *C09G 1/02* (2013.01); *H01L 21/304* (2013.01); *H01L 21/67219* (2013.01)

(58) Field of Classification Search
None
See application file for complete search history.

(56) References Cited

U.S. PATENT DOCUMENTS

2021/0238448 A1*   8/2021  Singh ................. B24B 37/00
2021/0340405 A1*  11/2021  Moon ................. C09K 3/1436

FOREIGN PATENT DOCUMENTS

CN     106867411 A      6/2017
KR     10-0643628 B1   11/2006
(Continued)

OTHER PUBLICATIONS

International Search Report for International Application No. PCT/KR2021/014483 issued by the International Searching Authority (Korean Patent Office) on Jan. 24, 2022.
(Continued)

*Primary Examiner* — Roberts P Culbert
(74) *Attorney, Agent, or Firm* — IP & T GROUP LLP

(57) ABSTRACT

The present invention relates to a polishing composition for a semiconductor process, a method of preparing the polishing composition, and a method of fabricating a semiconductor device using the polishing composition. The polishing composition for a semiconductor process contains abrasive particles, an accelerator, and a stabilizer. The polishing composition has excellent long-term storage stability because the particles contained therein do not aggregate even after the polishing composition is stored at 60° C. or higher for a long time. In addition, the polishing composition may be applied to a process of polishing an amorphous carbon layer, may exhibit a high removal rate, prevent carbon residue generated during the polishing process from
(Continued)

being adsorbed onto a semiconductor substrate, and prevent contamination of a polishing pad. The present invention may also provide a method of fabricating a semiconductor device using the polishing composition for a semiconductor process.

10 Claims, 1 Drawing Sheet

(51) Int. Cl.
  *H01L 21/304* (2006.01)
  *H01L 21/67* (2006.01)

(56) References Cited

FOREIGN PATENT DOCUMENTS

| KR | 10-2018-0064018 A | 6/2018 |
| KR | 20180064018 A | 6/2018 |
| KR | 10-2019-0053739 A | 5/2019 |
| KR | 10-2020-0053213 A | 5/2020 |
| KR | 10-2020-0057566 A | 5/2020 |
| KR | 20200057566 A | 5/2020 |
| KR | 10-2020-0062732 A | 6/2020 |

OTHER PUBLICATIONS

International Written Opinion for International Application No. PCT/KR2021/014483 issued by the International Searching Authority (Korean Patent Office) on Jan. 24, 2022.
Office Action on the Korean Patent Application No. 10-2021-0138360 issued by the Korean Patent Office on Oct. 19, 2023.
Office Action for Chinese Patent Application No. 202180083214.8 issued by the Chinese Patent Office on Jun. 18, 2025.

* cited by examiner

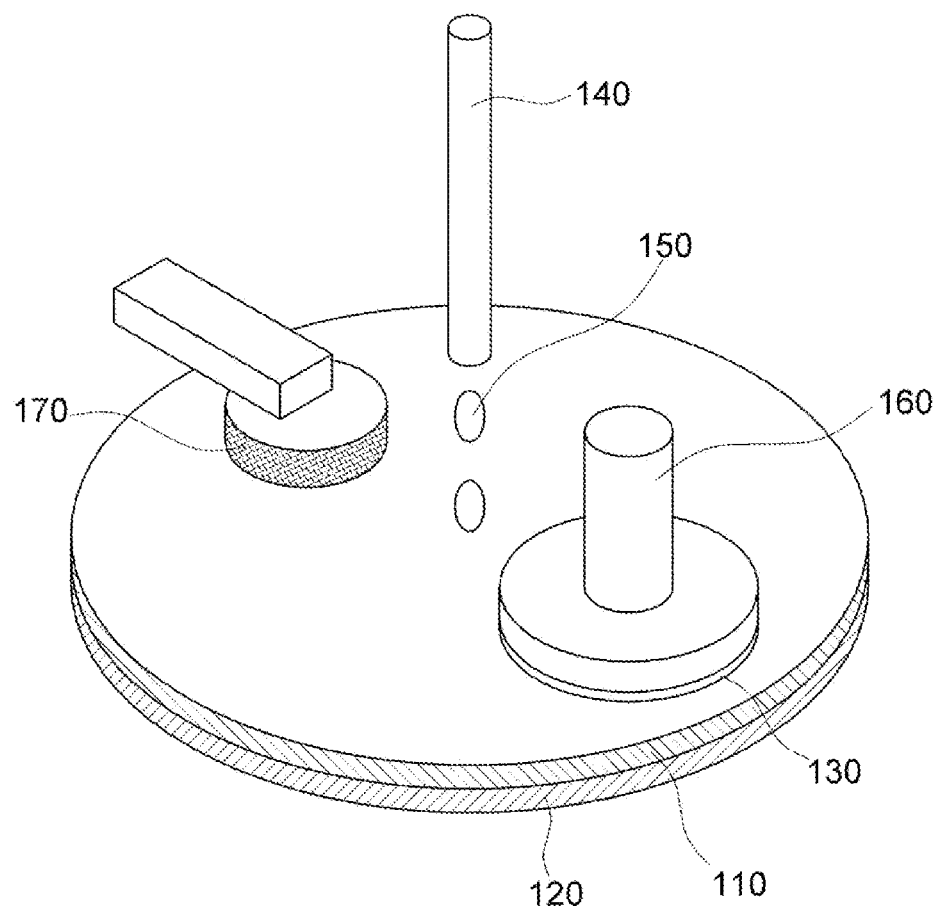

POLISHING COMPOSITION FOR SEMICONDUCTOR PROCESSING POLISHING COMPOSITION PREPARATION METHOD, AND SEMICONDUCTOR DEVICE MANUFACTURING METHOD TO WHICH POLISHING COMPOSITION IS APPLIED

This application is a national stage application of PCT/KR2021/014483 filed on Oct. 18, 2021, which claims priority to Korean Patent Application No. 10-2020-0187468 filed on Dec. 30, 2020, and Korean Patent Application No. 10-2021-0138360 filed on Oct. 18, 2021. The disclosure of each of the foregoing applications is incorporated herein by reference in its entirety.

TECHNICAL FIELD

The present invention relates to a polishing composition for a semiconductor process, a method of preparing the polishing composition, and a method of fabricating a semiconductor device using the polishing composition.

BACKGROUND ART

As semiconductor devices have become finer and denser, techniques for forming finer patterns have been used, and accordingly, surface structures of semiconductor devices have become more complex and the step difference between interlayer dielectric layers have also increased. In fabrication of a semiconductor device, a chemical mechanical polishing (hereinafter referred to as "CMP") process is used as a planarization technique for removing a stepped portion from a specific layer formed on a substrate.

In the CMP process, a surface of a substrate is polished while a slurry is provided to a polishing pad and the substrate is pressed and rotated. A target to be planarized varies depending on a step of the process, and there is also a difference in physical properties of the slurry applied at this time.

Specifically, the CMP process has been applied to the planarization of dielectric layers such as silicon oxide ($SiO_2$) and silicon nitride (SiN), and is also essentially used in planarization processes for metal wiring layers such as tungsten (W) and copper (Cu).

As semiconductor devices have become highly integrated, formation of finer patterns and multi-layered circuits has been required.

To this end, layers of various materials having different etch selectivity characteristics are required. Among these layers of various materials, carbon-based organic layers have good etch selectivity with respect to other silicon-containing layers, and thus may be used as mask layers or sacrificial layers.

In a semiconductor fabrication process, it is required to remove an organic layer by performing a chemical mechanical polishing process on the organic layer. However, a polishing composition capable of efficiently polishing an organic layer, which is applied in a semiconductor fabrication process, by applying the CMP process to the organic layer, has not been developed.

It is necessary to develop a polishing composition for a semiconductor process that is capable of solving the above-described problems.

DISCLOSURE

Technical Problem

An object of the present invention is to provide a polishing composition for a semiconductor process, a method of preparing the polishing composition, and a method of fabricating a semiconductor device using the polishing composition.

Another object of the present invention is to provide a polishing composition for a semiconductor process, which exhibits no reduction in removal rate when used in polishing at 60° C. or higher, and has excellent long-term storage stability because particles do not aggregate even after long-term storage.

Still another object of the present invention is to provide a polishing composition for a semiconductor process, which is applied to a process of polishing an amorphous carbon layer (ACL), may exhibit a high removal rate of the amorphous carbon layer to be polished, may prevent carbon residue generated during the polishing process from being adsorbed onto a semiconductor substrate, and may prevent contamination of a polishing pad.

Yet another object of the present invention is to provide a method of fabricating a semiconductor device using a polishing composition for a semiconductor process.

Technical Solution

To achieve the above objects, a polishing composition for a semiconductor process according to one embodiment of the present invention contains abrasive particles, an accelerator, and a stabilizer, and has a cohesion index (CI) of 0.5 to 5 as calculated by Equation 1 below:

$$CI = \frac{Saf}{Sai} \qquad \text{[Equation 1]}$$

wherein

Sai is the average particle diameter of the abrasive particles contained in the polishing composition for a semiconductor process, measured by a dynamic light scattering particle size analyzer, and Saf is the average particle diameter of the abrasive particles contained in the polishing composition for a semiconductor process, measured by the dynamic light scattering particle size analyzer after keeping the polishing composition for a semiconductor process at 60° C. for 17 hours and then cooling the polishing composition at 15 to 25° C.

A method of preparing a polishing composition for a semiconductor process according to another embodiment of the present invention may include steps of: a) preparing a polishing solution by mixing a stabilizer and an accelerator in a solvent; b) adjusting the pH of the polishing solution to 2 to 5 by adding a pH adjusting agent to the polishing solution; and c) mixing a surfactant and abrasive particles with the polishing solution having a pH of 2 to 5.

A method of fabricating a semiconductor device according to still another embodiment of the present invention may include steps of: 1) providing a polishing pad including a polishing layer; 2) supplying a polishing composition for a semiconductor process to the polishing pad; and 3) polishing a polishing target while allowing the polishing target and the polishing pad to rotate relative to each other so that the polishing-target surface of the polishing target comes into contact with the polishing surface of the polishing layer.

Advantageous Effects

The polishing composition for a semiconductor process according to the present invention exhibits no reduction in removal rate when used in polishing at 60° C. or higher, and has excellent long-term storage stability because particles contained therein do not aggregate even after long-term storage. In addition, the polishing composition may be applied to a process of polishing an amorphous carbon layer (ACL), may exhibit a high removal rate of the amorphous carbon layer to be polished, may prevent carbon residue generated during the polishing process from being adsorbed onto a semiconductor substrate, and may prevent contamination of a polishing pad.

The present invention may also provide a method of fabricating a semiconductor device using the polishing composition for a semiconductor process

BRIEF DESCRIPTION OF DRAWINGS

FIG. 1 is a schematic view showing a process for fabricating a semiconductor device according to one embodiment of the present invention.

BEST MODE

The present invention is directed to a polishing composition for a semiconductor process containing abrasive particles, an accelerator, and a stabilizer, and having a cohesion index (CI) of 0.5 to 5 as calculated by Equation 1 below:

$$CI = \frac{Saf}{Sai} \quad \text{[Equation 1]}$$

wherein
Sai is the average particle diameter of the abrasive particles contained in the polishing composition for a semiconductor process, measured by a dynamic light scattering particle size analyzer, and
Saf is the average particle diameter of the abrasive particles contained in the polishing composition for a semiconductor process, measured by the dynamic light scattering particle size analyzer after keeping the polishing composition for a semiconductor process at 60° C. for 17 hours and then cooling the polishing composition at 15 to 25° C.

MODE FOR INVENTION

Hereinafter, embodiments of the present invention will be described in detail so that those skilled in the art can easily carry out the present invention. However, the present invention may be embodied in a variety of different forms and is not limited to the embodiments described herein.

Hereinafter, embodiments of the present invention will be described in detail so that those skilled in the art can easily carry out the present invention. However, the present invention may be embodied in a variety of different forms and is not limited to the embodiments described herein.

In the present specification, it is to be understood that when any component is referred to as "including" or "containing" another component, it may further include other components, rather than excluding other components, unless otherwise specified.

In the present specification, when any component is referred to as being "connected to" another component, it not only refers to a case where any component is "connected directly to" another component, but also a case where any component is "connected to another component with a third component interposed therebetween".

In the present specification, the expression "B is located on A" means that B is located directly on A or B is located on A while another layer is located therebetween, and the expression is not construed as being limited to "B is located in contact with the surface of A".

As used herein, the term "combination thereof" included in any Markush-type expression refers to a mixture or combination of one or more selected from the group consisting of the components described in the Markush-type expression, and is meant to include one or more selected from the group consisting of the above components.

As used herein, the expression "A and/or B" refers to "A", "B", or "A and B".

As used herein, terms such as "first" and "second" or "A" and "B" are used to distinguish the same terms from each other, unless otherwise specified.

In the present specification, singular expressions are intended to include plural expressions as well, unless specified otherwise in the context thereof.

Hereinafter, the present invention will be described in more detail.

As semiconductor devices have become finer and denser, surface structures thereof have become more complex. The complexity of the surface structure means that the line width of the semiconductor device is narrowed. The aspect ratio (horizontal-to-vertical ratio) is also gradually increasing, and photoresist is gradually becoming thinner due to the increasing aspect ratio.

However, a phenomenon occurs in which elongate photoresist structures collapse without withstanding the etching process, and a hard mask process has been introduced to prevent this phenomenon.

As the hard mask materials, amorphous carbon and SiON have been used.

The amorphous carbon has excellent etching resistance when used as a hard mask. Nevertheless, when the amorphous carbon is subjected to a chemical mechanical polishing process using a conventional polishing composition, a problem arises in that the removal rate of the amorphous carbon is low and carbon residue is adsorbed onto the surface of the semiconductor substrate due to the generation of carbon residue, causing defects on the semiconductor substrate.

Accordingly, the polishing composition for a semiconductor process of the present invention may not only exhibit a high removal rate of an amorphous carbon layer, but also prevent re-adsorption of carbon residue, thereby preventing the occurrence of defects on a semiconductor substrate.

Specifically, the polishing composition for a semiconductor process according to the present invention contains abrasive particles, an accelerator, and a stabilizer, and has a cohesion index (CI) of 0.5 to 5 as calculated by Equation 1 below:

$$CI = \frac{Saf}{Sai} \quad \text{[Equation 1]}$$

wherein
Sai is the average particle diameter of the abrasive particles contained in the polishing composition for a semiconductor process, measured by a dynamic light scattering particle size analyzer, and
Saf is the average particle diameter of the abrasive particles contained in the polishing composition for a semiconductor process, measured by the dynamic light scattering particle size analyzer after keeping the polishing composition for a semiconductor process at 60° C. for 17 hours and then cooling the polishing composition at 15 to 25° C.

The polishing composition of the present invention exhibits no reduction in removal rate even when used in a polishing process performed at 60° C. or higher. In addition, aggregation or oxidation of the abrasive particles in the polishing composition does not occur, and thus an increase in the size of the particles may be prevented.

Specifically, when a polishing composition is stored for along time, the average diameter of particles contained therein may increase due to aggregation of the particles. If the average diameter of the particles increases as described above, a problem may arise in that the removal rate is lowered when the polishing composition is used in the polishing process. In addition, when the polishing composition is introduced into the polishing process which is performed at 60° C. or higher, aggregation of the abrasive particles in the polishing composition may occur.

On the other hand, the polishing composition of the present invention may prevent aggregation of the abrasive particles even when stored for a long time, thereby preventing the problem that the size of the abrasive particles increases. Specifically, by preventing aggregation of the abrasive particles as described above, it is possible to prevent a decrease in the removal rate and significantly improve the storage stability of the polishing composition.

Equation 1 above relates to the storage stability of the polishing composition of the present invention and to the stability of the polishing composition when used in polishing at 60° C. or higher. When the CI value calculated based on the initial average diameter (nm) of the abrasive particles and the average diameter (nm) value of the abrasive particles, measured after keeping the polishing composition at 60° C. for 17 hours and then cooling the polishing composition at 15 to 25° C., is 0.5 to 5 as calculated by Equation 1 above, it may be determined that there is no significant change in the average diameter of the particles.

As described above, this means that the average diameter of the particles does not change even when stored for a long time, indicating that the polishing composition has excellent storage stability and it is possible to prevent the problem that the removal rate is lowered upon long-term storage of the polishing composition.

The dynamic light scattering (DLS) technique is a non-invasive technique for measuring the size of nanoparticles in a dispersion. The dynamic light scattering technique is used to measure the time-dependent intensity of scattered light in a particle suspension using Brownian motion. By analyzing the variation in the intensity of the scattered light, a diffusion coefficient that can determine the particle size may be determined, and the particle size may be calculated from this coefficient through the Stoke-Einstein equation.

The average diameter of the particles may be measured by the dynamic light scattering technique, and the cohesion index (CI) value, calculated by Equation 1 above based on the average diameter value of the abrasive particles contained in the initial-state polishing composition and the average diameter value of the abrasive particles contained in the polishing composition that has undergone the aggregation acceleration process, may be 0.5 to 5, 0.5 to 1.50, 0.5 to 1.40, 0.5 to 1.30, 0.5 to 1.25, 0.7 to 1.22, 0.7 to 1.15, or 0.7 to 1.12. When the cohesion index is satisfied within the above range, the problem that the size of the abrasive particles increases may be prevented even upon long-term storage at 60° C. or higher, and thus the decrease in the removal rate may be prevented, indicating that the storage stability of the polishing composition may be greatly improved. In addition, even when the polishing composition is used in a polishing process at 60° C. or higher, the problem that the removal rate is lowered may not occur.

In another embodiment of the present invention, the rate of increase in the average diameter of the abrasive particles in the polishing composition may be 0.5% to 30% as calculated by Equation 2 below:

$$\frac{(Saf - Sai)}{Sai} \times 100 \qquad \text{[Equation 2]}$$

wherein

Sai is the average particle diameter of the abrasive particles contained in the polishing composition for a semiconductor process, measured by a dynamic light scattering particle size analyzer, and Saf is the average particle diameter of the abrasive particles contained in the polishing composition for a semiconductor process, measured by the dynamic light scattering particle size analyzer after keeping the polishing composition for a semiconductor process at 60° C. for 17 hours and then cooling the polishing composition at 15 to 25° C.

The value calculated by Equation 2 above may be 0.5% to 30%, 0.5% to 25%, 0.5% to 20%, 0.5% to 15%, 0.5% to 10%, or 0.5% to 7%. When the value calculated by Equation 2 above is satisfied within the above range, the problem that the size of the abrasive particles increases may be prevented even upon long-term storage at 60° C. or higher, and thus the decrease in the removal rate may be prevented, indicating that the storage stability of the polishing composition may be greatly improved. In addition, even when the polishing composition is used in a polishing process at 60° C. or higher, the problem that the removal rate is lowered may not occur, and the occurrence of defects may be prevented.

In particular, the polishing composition of the present invention may be used in a process of polishing an amorphous carbon layer (ACL), and the removal rate of the amorphous carbon layer may be 100 Å/min to 250 Å/min, 110 Å/min to 200 Å/min, or 120 Å/min to 200 Å/min. That is, when the removal rate in the process of polishing the amorphous carbon layer using the polishing composition is within the above range, the polishing efficiency may be excellent, and thus the polishing composition may be used in the polishing process for the amorphous carbon layer.

A conventional polishing composition has a problem in that the polishing composition exhibits a low removal rate of the amorphous carbon layer, and thus is difficult to apply to a polishing process.

In order to solve the above problem, development of technology for increasing the removal rate of the amorphous carbon layer by adding additives to a polishing composition has been made. However, in the case of the conventional polishing composition, even though the removal rate was increased, a problem arose in that the removal rate in the polishing process under a high-temperature condition is low, or aggregation of the abrasive particles occurs during long-term storage, indicating that the storage stability of the conventional polishing composition is poor.

In addition, problems arose in that carbon residue generated during the polishing process is adsorbed onto the surface of the semiconductor substrate and in that contamination of the polishing pad occurs.

The polishing composition of the present invention exhibits a removal rate of 100 Å/min to 250 Å/min when used in a polishing process for an amorphous carbon layer, indicating that the polishing composition may be used in the polishing process with a high removal rate. In addition, even when the polishing composition of the present invention is used in a polishing process at 60° C. or higher, no decrease in the removal rate occurs, and even after the polishing composition is stored for a long time, no decrease in the removal rate occurs.

In addition, the polishing composition of the present invention may prevent carbon residue generated during the polishing process from being adsorbed onto the surface of the semiconductor substrate, and prevent contamination of the polishing pad.

Specifically, the abrasive particles may be selected from the group consisting of, metal oxide particles, organic particles, organic-inorganic composite particles, and mixtures thereof.

The abrasive particles are abrasive particles applicable to a polishing composition for a semiconductor process, and may be selected from the group consisting of, for example, metal oxide particles, organic particles, organic-inorganic composite particles, and mixtures thereof. The metal oxide particles may be selected from the group consisting of colloidal silica, fumed silica, ceria, alumina, titania, zirconia, zeolite particles, and mixtures thereof, without being limited to the above examples, and any abrasive particles selectable by a person skilled in the art may be used without limitation.

Examples of the organic particles include polystyrene, styrene-based copolymer, poly(meth)acrylate, (meth)acrylate-based copolymer, polyvinyl chloride, polyamide, polycarbonate, or polyimide polymer particles, or core/shell structured particles in which the polymer constitutes a core, a shell, or both, and these particles may be used alone or in combination. The organic particles may be produced by emulsion polymerization, suspension polymerization, or the like.

Specifically, the abrasive particles of the present invention may be selected from the group consisting of colloidal silica, fumed silica, ceria particles, and mixtures thereof.

The abrasive particle may have an average diameter of 10 nm to 120 nm, 20 nm to 100 nm, 40 nm to 80 nm, 45 nm to 70 nm, or 70 nm to 80 nm. When the metal oxide particles fall within the scope of the present invention, it is possible to prevent the occurrence of defects such as scratches on a semiconductor substrate during a polishing process, and the abrasive particles may have excellent dispersibility.

The accelerator may be selected from the group consisting of anionic small molecules, anionic polymers, hydroxyl acids, amino acids, and cerium salts. Specifically, the cerium salt may be a trivalent cerium salt or a tetravalent cerium salt. More specifically, the tetravalent cerium salt may be selected from the group consisting of cerium (IV) sulfate ($Ce(SO_4)_2$), ammonium cerium sulfate dihydrate, and cerium ammonium nitrate, without being limited to the above examples.

The accelerator contained in the polishing composition may oxidize the surface layer of the amorphous carbon layer into oxides or ions, thereby facilitating removal of the surface layer of the amorphous carbon layer.

In addition, there is an advantage in that the accelerator allows an organic layer material residue present in a polishing stop layer to be easily removed, thereby enabling more uniform polishing.

The cerium ammonium nitrate may be present in the slurry composition in the form of an ionic compound or a chelate compound, and when the cerium ammonium nitrite is used in this form, it may increase the removal rate of an amorphous carbon layer.

However, if only the accelerator is contained to increase the removal rate of the amorphous carbon layer, the stability of the polishing composition may be low, making it difficult to store the polishing composition for a long time, and surface defects on the semiconductor substrate may occur during the polishing process.

Accordingly, in the present invention, the accelerator and the stabilizer are used in combination. In this case, the accelerator may exhibit the effect of increasing the removal rate of the amorphous carbon layer, and the stabilizer may increase the stability of the polishing composition and prevent the occurrence of defects in the polishing process.

Specifically, the stabilizer may be an amino acid. More specifically, the amino acid may be selected from the group consisting of arginine, histidine, lysine, aspartic acid, glutamic acid, glutamine, cysteine, proline, asparagine, threonine, alanine, glycine, valine, leucine, isoleucine, and mixtures thereof, and preferably, may be alanine, without being limited to the above examples, and it is possible to use any amino acid, which may be used in combination with the accelerator to increase the stability of the polishing composition and suppress the occurrence of defects in the polishing process, without limitation.

The polishing composition of the present invention may further contain a surfactant and may exhibit a high removal rate of an amorphous carbon layer. The surfactant may reduce surface tension, thereby preventing carbon residue from being re-adsorbed onto the semiconductor substrate.

If the polishing composition contains an accelerator to increase the removal rate of the amorphous carbon layer, the removal rate increases, but a problem may arise in that carbon residue generated during the polishing process is adsorbed onto the semiconductor substrate or in that contamination of the polishing pad occurs.

In order to solve the above problem, the surfactant is contained in the polishing composition to reduce the surface tension of the polishing composition. As the surface tension is reduced, re-adsorption of carbon residue to the substrate surface may be prevented, and contamination of the polishing pad may be prevented.

Specifically, the surfactant may include a nonionic fluorine-based polymer compound. The surfactant includes a fluorine-based polymer compound, and when it is used in a polishing process for an amorphous carbon layer, it may prevent generated carbon residue from being re-adsorbed onto the surface of the semiconductor substrate.

In addition, since the surfactant contains fluorine, it may suppress the multiplication of microorganisms such as bacteria and fungi. If a polishing composition is stored for a long period of time, bacteria and fungi may occur therein, and the polishing composition in which bacteria and fungi have occurred cannot be used in the polishing process and must be discarded.

In the polishing composition of the present invention, the surfactant includes a nonionic fluorine-based polymer compound, and when the polishing composition is stored for a long period of time, the nonionic fluorine-based polymer compound may prevent the occurrence of bacteria and fungi, thereby increasing the long-term storage stability of the polishing composition.

The surfactant of the present invention may be specifically selected from the group consisting of Chemours™

FS-30, FS-31, FS-34, ET-3015, ET-3150, ET-3050, and mixtures thereof, but any surfactant serving to prevent carbon residue generated in the polishing process from being re-adsorbed to the surface of the semiconductor substrate may be used without particular limitation.

The surfactant of the present invention may be a nonionic surfactant, and a surfactant including a nonionic fluorine-based polymer compound may be used alone or in combination with other nonionic surfactants.

The nonionic surfactant may be selected from the group consisting of polyethylene glycol, polypropylene glycol, a polyethylene-propylene copolymer, polyalkyl oxide, polyoxyethylene oxide (PEO), polyethylene oxide, and polypropylene oxide, and the fluorine-based surfactant may be selected from the group consisting of a sodium sulfonate fluorosurfactant, a phosphate ester fluorosurfactant, an amine oxide fluorosurfactant, a betaine fluorosurfactant, an ammonium carboxylate fluorosurfactant, a stearate ester fluorosurfactant, a quaternary ammonium fluorosurfactant, an ethylene oxide/propylene oxide fluorosurfactant, and a polyoxyethylene fluorosurfactant.

The polishing composition of the present invention may further contain a pH adjusting agent. The pH adjusting agent may be at least one selected from the group consisting of hydrochloric acid, phosphoric acid, sulfuric acid, hydrofluoric acid, nitric acid, hydrobromic acid, iodic acid, formic acid, malonic acid, maleic acid, oxalic acid, acetic acid, adipic acid, citric acid, acetic acid, propionic acid, fumaric acid, lactic acid, salicylic acid, pimelic acid, benzoic acid, succinic acid, phthalic acid, butyric acid, glutaric acid, glutamic acid, glycolic acid, lactic acid, aspartic acid, tartaric acid, and potassium hydroxide.

The pH adjusting agent may adjust the pH of the polishing composition for a semiconductor process to 2 to 5, preferably 2 to 4. When the polishing composition is maintained at an acidic pH within the above range, it is possible to maintain the removal rate and the quality of the polishing composition at certain levels or higher while preventing excessive corrosion of metal components or a polishing device.

The polishing composition for a semiconductor process may contain 0.1 wt % to 0.5 wt % of the abrasive particles, 1 wt % to 2 wt % of the accelerator, 1 wt % to 2 wt % of the stabilizer, 0.001 wt % to 0.01 wt % of the surfactant, and the balance of a solvent. When the above components are contained in the polishing composition in amounts within the above ranges, the accelerator may be stabilized by the stabilizer, and thus the removal rate may be increased by the accelerator in the polishing composition, and the occurrence of defects in a polishing process may be prevented by the stabilizer and the surfactant.

The solvent may be ultrapure water, but is not limited to the above example, and any solvent may be used without limitation as long as it may be a solvent for the polishing composition.

If the surfactant is contained in an amount smaller than the lower limit of the above range, a problem arises in that the occurrence of surface defects on a semiconductor substrate in a polishing process increases, and if the surfactant is contained in an amount larger than the upper limit of the above range, a problem arises in that a large amount of bubbles are generated during the preparation of the polishing composition.

A method of preparing a polishing composition according to the present invention may include steps of: a) preparing a polishing solution by mixing a stabilizer and an accelerator in a solvent; b) adjusting the pH of the polishing solution to 2 to 5 by adding a pH adjusting agent to the polishing solution; and c) mixing a surfactant and abrasive particles with the polishing solution having a pH of 2 to 5.

In step a), a stabilizer may be mixed with a solvent in order to stabilize an accelerator, thereby preparing a first solution, and then the accelerator may be mixed with the first solution, thereby preparing a polishing solution.

If a polishing composition is prepared by mixing the accelerator with a stabilizer, a pH adjusting agent, a surfactant and abrasive particles in ultrapure water as a solvent, the accelerator may not be stabilized in the polishing composition, making it difficult to store the prepared polishing composition for a long time, or the effect of increasing the removal rate by the accelerator in the polishing composition may not appear.

To prevent this problem, a mixed solution is prepared by mixing a stabilizer with a solvent, and then a polishing solution is prepared by dissolving an accelerator in the mixed solution, and then a polishing composition is prepared by a subsequent step.

A method for fabricating a semiconductor device according to still another embodiment of the present invention includes steps of: 1) providing a polishing pad including a polishing layer; 2) supplying a polishing composition for a semiconductor process to the polishing pad; and 3) polishing a polishing target while allowing the polishing target and the polishing pad to rotate relative to each other so that the polishing-target surface of the polishing target comes into contact with the polishing surface of the polishing layer, wherein the polishing composition contains abrasive particles, an accelerator, and a stabilizer, and has a cohesion index (CI) of 0.5 to 5 as calculated by Equation 1 below:

$$CI = \frac{Saf}{Sai} \quad \text{[Equation 1]}$$

wherein

Sai is the average particle diameter of the abrasive particles contained in the polishing composition for a semiconductor process, measured by a dynamic light scattering particle size analyzer, and Saf is the average particle diameter of the abrasive particles contained in the polishing composition for a semiconductor process, measured by the dynamic light scattering particle size analyzer after keeping the polishing composition for a semiconductor process at 60° C. for 17 hours and then cooling the polishing composition at 15 to 25° C.

FIG. 1 is a schematic view showing a process for fabricating a semiconductor device according to one embodiment of the present invention. Referring to FIG. 1, according to the embodiment, a polishing pad 110 is mounted on a platen 120, and then a semiconductor substrate 130 as a polishing target is disposed on the polishing pad 110. For polishing, a polishing slurry 150 is sprayed onto the polishing pad 110 through a nozzle 140.

The flow rate of the polishing slurry 150 that is supplied through the nozzle 140 may be selected within the range of about 10 cm³/min to about 1,000 cm³/min depending on the purpose, and may be, for example, about 50 cm³/min to about 500 cm³/min, without being limited thereto.

Here, the polishing-target surface of the semiconductor substrate 130 is in direct contact with the polishing surface of the polishing pad 110.

Next, the semiconductor substrate 130 and the polishing pad 110 may be rotated relative to each other, so that the surface of the semiconductor substrate 130 may be polished. In this case, the rotating direction of the semiconductor substrate 130 and the rotating direction of the polishing pad 110 may be the same direction or may be opposite to each other. The rotating speed of each of the semiconductor substrate 130 and the polishing pad 110 may be selected within the range of about 10 rpm to about 500 rpm depending on the purpose, and may be, for example, about 30 rpm to about 200 rpm, without being limited thereto.

In an example of the substrate polishing process, an organic layer on a substrate may be polished, and the present invention may be applied to a process of polishing a carbon-based organic layer.

Specifically, the carbon-based organic layer may be, for example, a C-SOH (spin-on-hardmask) layer, an amorphous carbon layer, or an NCP layer, and is preferably an amorphous carbon layer for which the polishing composition may have an excellent selective polishing effect and exhibit a high removal rate.

Contents regarding the polishing composition for a semiconductor process overlap with those described above, and thus detailed description thereof will be omitted.

In one embodiment, the method for fabricating a semiconductor device may further include a step of processing the polishing surface of the polishing pad 110 by a conditioner 170 at the same time as polishing of the semiconductor substrate 130 in order to maintain the polishing surface of the polishing pad 110 in a state suitable for polishing.

Preparation of Composition for Semiconductor Polishing

Example 1

A mixed solution was prepared by mixing ultrapure water with alanine as a stabilizer, and a polishing solution was prepared by mixing cerium ammonium nitrite with the mixed solution.

The pH of the polishing composition was adjusted to 2.1 by adding nitric acid to the polishing solution, and the polishing solution was mixed with Chemours™ FS-30 as a surfactant and colloidal silica having a diameter of 75 nm, thereby preparing a polishing composition.

The contents of components in Examples 1 to 5 and Comparative Examples 1 to 3 are shown in Table 1 below.

Experimental Example 1

Measurement of Removal Rate Depending on Change in Abrasive Particle Size

The removal rate of an amorphous carbon layer (ACL) for each of Example 1, Comparative Example 1 and Comparative Example 2 was measured, thereby determining the removal rate of the ACL depending on a change in the size of the abrasive particles.

The removal rate was measured after performing a polishing process on an amorphous carbon layer (ACL) having a thickness of 2,000 Å for 60 seconds under the following conditions: a polishing pressure of 2 psi, a carrier rotation speed of 87 rpm, a platen rotation speed of 93 rpm, and a feed flow rate of the polishing composition of 200 ml/min,

TABLE 2

|  | Removal rate (Å/min) |
| --- | --- |
| Example 1 | 141 |
| Comparative Example 1 | 63 |
| Comparative Example 2 | 103 |

Table 2 above compares the removal rate depending on the average diameter of the abrasive particles included in the polishing composition, and Example 1 exhibited a removal rate of 141 Å/min, which is higher than 120 Å/min. On the other hand, Comparative Example 1, in which the average diameter of the abrasive particles was 45 nm, exhibited a removal rate of 63 Å/min, and Comparative Example 2, in which the average diameter of the abrasive particles was 60 nm, exhibited a removal rate of 103 Å/min, indicating that Comparative Examples 1 and 2 exhibited low removal rates of the amorphous carbon layer. From the above experimental results, it was confirmed that the removal rate of the amorphous carbon layer was low when the size of the abrasive particles was small.

Experimental Example 2. Measurement Results of Removal Rate and Surface Defects Depending on Content Range of Abrasive Particles For the polishing compositions having different contents of abrasive particles and containing colloidal silica having a

TABLE 1

|  | Abrasive particles | | Accelerator | Stabilizer | Surfactant | Solvent |
| --- | --- | --- | --- | --- | --- | --- |
|  | Size (nm) | Content | | | | |
| Example 1 | 75 | 0.25 | 0.6 | 1 | 0.005 | Balance |
| Example 2 | 45 | 1.25 | 0.6 | 1 | 0.005 | |
| Example 3 | 45 | 0.25 | 0.6 | 1 | 0.005 | |
| Example 4 | 75 | 2.5 | 0.6 | 1 | 0.005 | |
| Example 5 | 75 | 1.25 | 0.6 | 1 | 0.005 | |
| Comparative Example 1 | 45 | 0.25 | 0.6 | 1 | 0.005 | |
| Comparative Example 2 | 60 | 0.25 | 0.6 | 1 | 0.005 | |
| Comparative Example 3 | 45 | 2.5 | 0.6 | 1 | 0.005 | |

(Unit: wt %)

particle size of 75 nm or colloidal silica having a particle size of 45 nm as the abrasive particles, the removal rate, the number of defects, and the change in the particle size with a change in temperature were measured.

The removal rate was measured under the same polishing conditions as described in Experimental Example 1, and whether defects occurred was examined using KLA Tencor AIT-XP+.

In order to determine whether the particle size increased, the initial average diameter of the particles and the average diameter of the particles after heating were measured using a dynamic light scattering particle size analyzer.

As for the heating conditions for the measurement, the polishing composition was kept in an oven preheated to 60° C. for 17 hours, and then cooled at 20° C., and the average diameter was measured.

For the dynamic light scattering particle size analysis, a dynamic light scattering particle size analyzer, specifically, Malvern Nano-ZS, was used, colloidal silica was input as the material, and 1.457 was input as the refractive index.

2 ml of each of the polishing compositions of the Examples and the Comparative Examples was injected into the dynamic light scattering particle size analyzer, and the average diameter of the particles was measured.

Based on the measured average diameters of the particles, the CI value was calculated by Equation 1 below, and the rate of increase in the average diameter of the abrasive particles was calculated by Equation 2 below:

$$CI = \frac{Saf}{Sai} \quad \text{[Equation 1]}$$

$$\frac{(Saf - Sai)}{Sai} \times 100 \quad \text{[Equation 2]}$$

wherein

Sai is the average particle diameter of the abrasive particles contained in the polishing composition for a semiconductor process, measured by a dynamic light scattering particle size analyzer, and Saf is the average particle diameter of the abrasive particles contained in the polishing composition for a semiconductor process, measured by the dynamic light scattering particle size analyzer after keeping the polishing composition for a semiconductor process subjected to the aggregation acceleration process of keeping the polishing composition at 60° C. for 17 hours and then cooling the polishing composition at 15 to 25° C.

TABLE 3

|  | Removal rate (Å/min) | Defect (ea) | Initial average particle diameter (nm) | Average particle diameter (nm) after heating | Diameter increase rate (Equation 2, %) | Value calculated by Equation 1 |
|---|---|---|---|---|---|---|
| Example 1 | 141 | 21003 | 75.26 | 75.79 | 1 | 1.01 |
| Example 2 | 83 | 29500 | 44.8 | 49.85 | 11 | 1.11 |
| Example 3 | 60 | 21167 | 46.11 | 47.18 | 2 | 1.02 |
| Example 4 | 116 | 59623 | 73.42 | 89.21 | 22 | 1.22 |
| Example 5 | 145 | 31185 | 75.86 | 81.77 | 8 | 1.08 |
| Comparative Example 3 | 102 | 54327 | 44.01 | 230.9 | 425 | 5.25 |

Referring to Table 3 above, it was confirmed that the polishing compositions of Examples 1 to 5 had a value of about 1 as calculated by Equation 1 above, indicating that the average diameter of the particles did not significantly change, even after each of the polishing compositions was kept was in the oven preheated to 60° C. for 17 hours and then cooled at 20° C. As a result of analyzing the polishing compositions of the other Examples, it was confirmed that, when the particle diameter was 45 nm, the removal rate increased as the content increased, but the size of the abrasive particles increased after the polishing composition was kept in the oven preheated to 60° C. for 17 hours and cooled at 20° C., and when the particle diameter was 75 nm, the removal rate did not significantly differ as the content of the abrasive particles increased, and the increase in the particle size after heating was large compared to when the particle diameter was 45 nm. On the other hand, it was confirmed that, in the case of the polishing composition of Comparative Example 3 in which the average diameter of the abrasive particles was 45 nm and the content of the abrasive particles was 2.5 wt %, the rate of increase in the average diameter of the abrasive particles after heating was very high, and thus the occurrence of defects greatly increased.

Although preferred embodiments of the present invention have been described in detail above, the scope of the present invention is not limited thereto, and various modifications and improvements made by those skilled in the art without departing from the basic concept of the present invention as defined by the appended claims also fall within the scope of the present invention.

110: polishing pad
120: platen
130: semiconductor substrate
140: nozzle
150: polishing slurry
160: polishing head
170: conditioner

INDUSTRIAL APPLICABILITY

The present invention relates to a polishing composition for a semiconductor process, a method of preparing the polishing composition, and a method of fabricating a semiconductor device using the polishing composition.

The invention claimed is:

1. A polishing composition for a semiconductor process, comprising:
   abrasive particles;
   an accelerator; and
   a stabilizer, wherein the abrasive particles have an average diameter of 70 nm to 120 nm, wherein the polishing composition has a removal rate of an amorphous carbon layer of 110 Å/min to 250 Å/min, wherein the removal rate of an amorphous carbon layer is determined under the following measurement conditions: an amorphous carbon layer (ACL) having a thickness of 2000 Å, a polishing time of 60 seconds, an applied pressure of 2 psi, a carrier speed of 87 rpm, a platen speed of 93 rpm, and a polishing composition flow rate of 200 mL/min, wherein the polishing composition has a cohesion index (CI) of 0.5 to 5 as calculated by Equation 1 below:

$$CI = \frac{Saf}{Sai} \quad \text{[Equation 1]}$$

wherein

Sai is an average particle diameter of the abrasive particles contained in the polishing composition for a semiconductor process, measured by a dynamic light scattering particle size analyzer, and Saf is an average particle diameter of the abrasive particles contained in the polishing composition for a semiconductor process, measured by the dynamic light scattering particle size analyzer after keeping the polishing composition at 60° C. for 17 hours and then cooling the polishing composition at 15 to 25° C.

2. The polishing composition of claim 1, wherein the abrasive particles are selected from the group consisting of metal oxide particles, organic particles, organic-inorganic composite particles, and mixtures thereof.

3. The polishing composition of claim 1, wherein the accelerator is selected from the group consisting of anionic small molecules, anionic polymers, hydroxyl acids, and cerium salts.

4. The polishing composition of claim 1, wherein the stabilizer is an amino acid.

5. The polishing composition of claim 1, further containing a surfactant.

6. The polishing composition of claim 1, further containing a pH adjusting agent.

7. The polishing composition of claim 1, wherein a rate of increase in the average diameter of the abrasive particles is 0.5% to 30% as calculated by Equation 2 below:

$$\frac{(Saf - Sai)}{Sai} \times 100$$

wherein

Sai is the average particle diameter of the abrasive particles contained in the polishing composition, measured by a dynamic light scattering particle size analyzer, and Saf is the average particle diameter of the abrasive particles contained in the polishing composition, measured by the dynamic light scattering particle size analyzer after keeping the polishing composition at 60° C. for 17 hours and then cooling the polishing composition at 15 to 25° C.

8. A method of preparing the polishing composition of claim 1, the method comprising steps of:
a) preparing a polishing solution by mixing a stabilizer and an accelerator in a solvent;
b) adjusting a pH of the polishing solution to 2 to 5 by adding a pH adjusting agent to the polishing solution; and
c) mixing a surfactant and abrasive particles with the polishing solution having a pH of 2 to 5, wherein the polishing composition has a cohesion index (CI) of 0.5 to 5 as calculated by Equation 1 below:

$$CI = \frac{Saf}{Sai} \quad \text{[Equation 1]}$$

wherein

Sai is an average particle diameter of the abrasive particles contained in the polishing composition for a semiconductor process, measured by a dynamic light scattering particle size analyzer, and Saf is an average particle diameter of the abrasive particles contained in the polishing composition for a semiconductor process, measured by the dynamic light scattering particle size analyzer after keeping the polishing composition at 60° C. for 17 hours and then cooling the polishing composition at 15 to 25° C.

9. The method of claim 8, wherein step a) comprises:
preparing a mixed solution by mixing the stabilizer with the solvent; and
preparing the polishing solution by mixing the mixed solution with the accelerator.

10. A method of fabricating a semiconductor, the method comprising steps of:
1) Providing a polishing pad comprising a polishing layer;
2) Supplying the polishing composition of claim 1; and
3) Polishing a polishing target while allowing the polishing target and the polishing pad to rotate relative to each other so that a polishing-target surface of the polishing target comes into contact with a polishing surface of the polishing layer, wherein the polishing composition contains abrasive particles, an accelerator, and a stabilizer, and has a cohesion index (CI) of 0.5 to 5 as calculated by Equation 1 below:

$$CI = \frac{Saf}{Sai} \quad \text{[Equation 1]}$$

wherein

Sai is an average particle diameter of the abrasive particles contained in the polishing composition for a semiconductor process, measured by a dynamic light scattering particle size analyzer, and Saf is an average particle diameter of the abrasive particles contained in the polishing composition for a semiconductor process, measured by the dynamic light scattering particle size analyzer after keeping the polishing composition at 60° C. for 17 hours and then cooling the polishing composition at 15 to 25° C.

* * * * *